US008880907B2

(12) United States Patent
Ives et al.

(10) Patent No.: US 8,880,907 B2
(45) Date of Patent: Nov. 4, 2014

(54) METHOD AND SYSTEM FOR DETERMINING PHYSICAL LOCATION OF EQUIPMENT

(75) Inventors: Edward Ives, Exeter, RI (US); Stephen Berard, Seattle, WA (US); Gert Lehmann, Vejle (DK)

(73) Assignee: Schneider Electric IT Corporation, West Kingston, RI (US)

( * ) Notice: Subject to any disclaimer, the term of this patent is extended or adjusted under 35 U.S.C. 154(b) by 1168 days.

(21) Appl. No.: 11/766,187

(22) Filed: Jun. 21, 2007

(65) Prior Publication Data
US 2008/0317021 A1  Dec. 25, 2008

(51) Int. Cl.
*G06F 1/00* (2006.01)
*H04L 12/10* (2006.01)
*H05K 7/14* (2006.01)
*H04L 12/26* (2006.01)
*H04L 12/24* (2006.01)

(52) U.S. Cl.
CPC ............ *H04L 12/10* (2013.01); *H04L 43/0817* (2013.01); *H05K 7/1498* (2013.01); *H04L 41/22* (2013.01); *Y02B 60/50* (2013.01); *H04L 41/12* (2013.01); *H04L 41/0806* (2013.01); *H04L 41/085* (2013.01)
USPC .......................................... 713/300; 713/340

(58) Field of Classification Search
USPC ................. 713/300, 310, 320, 330, 324, 340
See application file for complete search history.

(56) References Cited

U.S. PATENT DOCUMENTS

| | | | |
|---|---|---|---|
| 4,918,615 A * | 4/1990 | Suzuki et al. ................ | 700/275 |
| 6,721,672 B2 | 4/2004 | Spitaels et al. | |
| 6,782,436 B1 | 8/2004 | Baker | |
| 6,847,295 B1 * | 1/2005 | Taliaferro et al. ........ | 340/539.13 |
| 7,035,936 B2 | 4/2006 | Fouquet et al. | |
| 7,483,797 B2 * | 1/2009 | Nambu ............................ | 702/60 |
| 2002/0191472 A1 * | 12/2002 | Okamoto et al. ............. | 365/227 |
| 2003/0128111 A1 * | 7/2003 | Sano et al. .................... | 340/459 |
| 2003/0232598 A1 * | 12/2003 | Aljadeff et al. .............. | 455/41.2 |

(Continued)

FOREIGN PATENT DOCUMENTS

| CN | 1661971 A | 8/2005 |
|---|---|---|
| EP | 1571564 A2 | 9/2005 |

(Continued)

OTHER PUBLICATIONS

International Search Report from corresponding international application PCT/US2008/067451 dated Dec. 16, 2008.

(Continued)

*Primary Examiner* — Michael J Moore, Jr.
*Assistant Examiner* — Ajay Cattungal
(74) *Attorney, Agent, or Firm* — Lando & Anastasi, LLP

(57) ABSTRACT

Systems and methods are provided for automatically determining certain physical characteristics of a network device. In one embodiment, a method is employed to automatically determine the physical location of a network device. This method may employ a computer based system to acquire network device information, instruct the network devices to change power consumption, detect the changes and determine the physical location of the network device based on the changes detected. In another embodiment, a method is employed to automatically determine the functional type of a network device. This method may employ a computer based system to monitor the power drawn by the network device at a power distribution device and determine the network device functional type based on the power drawn.

18 Claims, 9 Drawing Sheets

(56) References Cited

U.S. PATENT DOCUMENTS

| | | |
|---|---|---|
| 2004/0073597 A1 | 4/2004 | Caveney et al. |
| 2004/0075419 A1* | 4/2004 | Massey et al. ............... 320/117 |
| 2004/0141490 A1* | 7/2004 | Hong ........................... 370/345 |
| 2005/0116836 A1* | 6/2005 | Perry et al. .............. 340/870.02 |
| 2005/0166221 A1* | 7/2005 | Pugel et al. ..................... 725/33 |
| 2005/0192713 A1* | 9/2005 | Weik et al. ................... 700/295 |
| 2005/0198271 A1* | 9/2005 | Rubinstein ................... 709/224 |
| 2006/0047983 A1* | 3/2006 | Aleyraz et al. .............. 713/300 |
| 2006/0108988 A1* | 5/2006 | McKelvey et al. ........... 323/205 |
| 2006/0132062 A1* | 6/2006 | Maru et al. ................... 315/291 |
| 2006/0167569 A1* | 7/2006 | Colombi et al. ............... 700/22 |
| 2006/0267864 A1* | 11/2006 | Miyazawa et al. ............. 345/52 |
| 2007/0037575 A1* | 2/2007 | Braam et al. .............. 455/435.3 |
| 2007/0061050 A1* | 3/2007 | Hoffknecht ................... 700/291 |
| 2007/0073420 A1* | 3/2007 | Lanni ............................. 700/22 |
| 2007/0094527 A1* | 4/2007 | Frietsch et al. ............... 713/340 |
| 2007/0221668 A1* | 9/2007 | Baarman et al. .............. 219/746 |
| 2008/0004063 A1* | 1/2008 | Haapoja et al. ............... 455/522 |
| 2008/0004067 A1* | 1/2008 | Piipponen et al. ......... 455/550.1 |
| 2008/0252518 A1* | 10/2008 | Yeshayahu ............... 342/357.02 |
| 2008/0258556 A1* | 10/2008 | Ewing et al. .................... 307/23 |
| 2010/0115259 A1* | 5/2010 | Elsila et al. ................... 713/100 |
| 2010/0141442 A1* | 6/2010 | Matsuyama et al. .......... 340/541 |

FOREIGN PATENT DOCUMENTS

| | | |
|---|---|---|
| JP | 07-248983 A | 9/1995 |
| JP | 2002-305845 A | 10/2002 |
| JP | 2003-153347 A | 5/2003 |
| JP | 2003241859 A | 8/2003 |
| JP | 2003259569 A | 9/2003 |
| JP | 2003-339086 A | 11/2003 |
| JP | 2004222374 A | 8/2004 |
| JP | 2004275038 A | 10/2004 |
| JP | 2005-045865 A | 2/2005 |
| JP | 2006155329 A | 6/2006 |
| WO | 98/23055 A1 | 5/1998 |

OTHER PUBLICATIONS

Centennial Discovery, "Agent vs. Agent-less auditing", www.centennial-software.com, initially reviewed on or about Aug. 18, 2006.

* cited by examiner

METHOD AND SYSTEM FOR DETERMINING PHYSICAL LOCATION OF EQUIPMENT

BACKGROUND OF INVENTION

1. Field of Invention

At least one embodiment of the invention relates generally to methods and systems for automatically discovering characteristics of information technology network devices, and more specifically, to a method and system for discovering characteristics of a network device via network monitoring and power management equipment.

2. Discussion of Related Art

In response to the increasing demands of information-based economies, information technology networks continue to proliferate across the globe. This expansion has taken on various forms including widely distributed computer networks, which link together geographically disparate computing resources, and centralized network data centers, which provide shared power, cooling and telecommunication infrastructure to a host of collocated network devices. As the kind, size and complexity of these information technology networks grow, so do the costs associated with their operation. These costs include the cost of acquiring network devices and infrastructure, the cost of the power consumed by the network devices and cooling systems, and the salary of network administration staff.

As the magnitude of the costs associated with information technology networks has increased, so has the market's focus on enabling organizations to better manage them. To help organizations decrease the cost of acquiring and maintaining their network devices and infrastructure, software companies have developed asset management applications that streamline the inventory and tracking of an organization's information technology hardware and software. For instance, RFID tags or bar code labels may be affixed to network devices to aid in tracking their location. Through these tools, activities such as software license compliance, hardware and software upgrades, and leased device rotation can be planned and coordinated from a centralized repository of inventory information. In a related area, to decrease the network administration staff required to support information technology networks, software companies have authored programs that enable centralized software distribution and monitoring of information technology network devices. Thus network administrators can perform software maintenance, including software upgrades, pinpoint problem network devices, and take remedial steps, all from a remote location.

In an analogous fashion, the desire to maximize both network device uptime and minimize power usage has led to several advances in power management technology. As an example, network physical infrastructure companies, which traditionally have focused their efforts on ensuring uninterrupted flow of power to certain network devices, have created technology that remotely monitors the power consumption of network devices and controls power supplied to the individual power outlets. Complimentarily to these advances, network device manufacturers have made network devices that are capable of decreasing their level of power consumption based on what device functionality is being utilized.

SUMMARY OF INVENTION

Embodiments of the invention provide systems and methods for determining characteristics of network devices by using network monitoring and power management equipment. At least one embodiment provides a system and method to determine the physical location of a network device. Another embodiment provides a system and a method to determine the functional type of a network device.

A first aspect is directed toward a method of determining a physical location of a network device by detecting a change in power at a power distribution device having a physical location and coupled to the network device to provide power to the network device. This first aspect also includes determining the physical location of the network device based on the physical location of the power distribution device. Determining the physical location of the network device may include comparing the change in power with a change in network device utilization.

The method may further include, as a first step, waiting for an event to occur. The event may include installing a new network device, replacing a network device, or instructing the network device to change power consumption as soon as possible, or at a predetermined time in the future. The instructed change in power consumption may include a reduction or an increase. Also instructing the network device to change power consumption may include accessing the network device over a network.

The method may further include associating the physical location of the network device with the physical location of the power distribution device. Also, the method may further include display a representation of the network device in a physical context using a graphical display. Lastly, the method may further include displaying a representation of a power distribution device and network devices associated with the power distribution device.

A second aspect is directed to a method of determining a functional type of a network device including monitoring power drawn by the network device at a power distribution device, and determining the functional type of a network device based on the power drawn.

Where the network device includes a transfer switch having a first input for a first power supply and a second input for a second power supply, the method may further include identifying a power distribution device that supplies the first power supply, and identifying a power distribution device that supplies the second power supply.

A third aspect is directed toward a computer-readable medium having computer-readable signals stored thereon that define instructions that, as a result of being executed by a processor, instruct the processor to detect a change in power at a power distribution device having a physical location and coupled to the network device to provide power to the network device and to determine the physical location of the network device based on the physical location of the power distribution device. Determining the physical location of the network device may include comparing the change in power with a change in network device utilization.

Another aspect of the invention is directed toward a computer-readable medium having computer-readable signals stored thereon that define instructions that, as a result of being executed by a processor, instruct the processor to monitor power drawn by the network device at a power distribution device and determine the functional type of a network device based on the power drawn.

Another aspect is directed toward a system for detecting a physical location of a network device including at least one input arranged and configured to receive network device information, at least one controller arranged and configured to detect a change in power at a power distribution device having a physical location and coupled to the network device, and further arranged and configured to determine the physical location of the network device and at least one output arranged and configured to display the physical location of the network device. Lastly, the controller may be further arranged and configured to instruct at least one network device to change power consumption.

Another aspect of the invention is directed to a system for automatically detecting a functional type of a network device including at least one input arranged and configured to receive network device information, at least one controller arranged and configured to generate a list of potential network device functional types supplied by a power distribution device based on a power demand at the power distribution device, at least one output arranged and configured to display the list of potential network device functional types for selection, and at least one input arranged and configured to record the selection.

At least one controller may be further arranged and configured to determine at least one network device including a transfer switch having a first input for a first power supply and a second input for a second power supply, and at least one output may be further arranged and configured to display at least one network device including a transfer switch. Lastly, at least one output may be further arranged and configured to display a power distribution device that supplies the first power supply and a power distribution device that supplies the second power supply.

BRIEF DESCRIPTION OF DRAWINGS

The accompanying drawings, are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
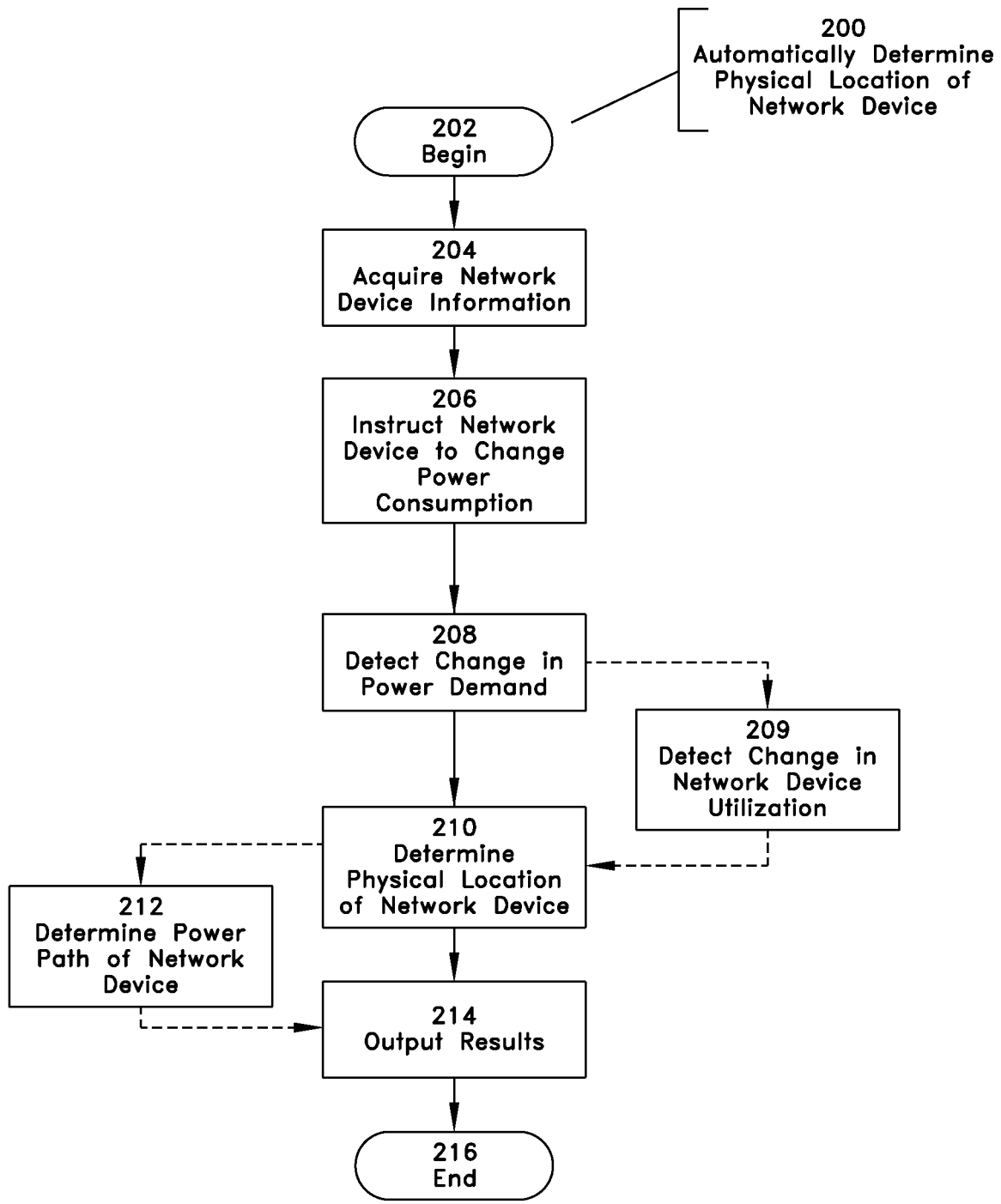
FIG. 1 is a flow chart of a process for automatically determining the physical location of network devices according to one embodiment of the invention.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including", "comprising", "having", "containing", "involving" and variations thereof herein, is meant to be open-ended, i.e. including but not limited to.

At least one aspect of the present invention relates to a system and method for automatically determining the physical location of network devices. Such a system or method may be implemented with respect to a network data center, often using an automated centralized network manager such as American Power Conversion Corporation's (APC's) InfraStruXure® Central Server, Part Number AP9475. In at least one embodiment, the network manager instructs a network device to change its power consumption. The network manager then detects the resulting change in power demanded at a particular power outlet by monitoring network power distribution units (PDU's). These PDU's may be any power distribution device from which power demand levels may be ascertained including generators, three phase PDU's, uninterruptible power supplies (UPS's), automatic transfer switches (ATS's), powered telephony equipment, Power Over Ethernet (PoE) Routers and Switches and rack PDU's, such as APC's Switched Rack PDU, Part Number AP7900. The location of the network device, e.g. the specific location within a rack of a server, may then be ascertained based on the location of its servicing power outlet. In another embodiment, the network manager monitors and records power changes that result from normal network device operation and compares them to changes in power demand to ascertain the location of the network device.

FIG. 1 shows an example process 200 for automatically determining the physical location of network devices according to one embodiment of the present invention. This process may be implemented using the InfraStruXure® Central Server discussed above or a general-purpose computer system as discussed with regard to FIG. 5 below. At block 202, process 200 begins. At block 204, network device information is acquired. A network device may include, for example, any apparatus that is capable of communicating via a network. Examples of network devices include servers, desktop computers, laptop computers, routers, PDU's, ATS's, network capable printers, switches, Voice over Internet Protocol Private Branch eXchanges (VoIP PBX's), server appliances and IP telephones. In one embodiment, the network device information acquired may include the identity and functional type of one or more network devices. Although sundry ways to uniquely identify a network device are known in the art, perhaps the most common examples are via TCP/IP address, network device name or Simple Network Management Protocol (SNMP) object identifier. The functional type of a network device may be based on the function the device performs, e.g. server, printer, router, PDU, ATS, etc. Lastly, the network device information acquired may include any security credentials required to access the network device.

At block 206, a network device may be instructed over the network to change its power consumption. Typically, the initiator of the instruction will be required to supply security credentials to initiate the instruction, and therefore, such information may be included with the instruction. The instruction may take the form of a remote procedure call, or any other protocol by which a network device may be instructed to perform a power consumption change. The change in the power consumption may be either an increase or a decrease, and the change may be specified to occur at a particular time and have a specified duration.

At block 208, a change in the power demand at a specific power outlet having an established physical location is detected. In one embodiment, power outlets are associated with rack PDU's whose physical locations are entered and recorded during installation of the rack PDU's and remain relatively static over time. In another embodiment, the physical location of each power outlet is individually entered during installation of the rack PDU. In other embodiments, physical location information may be input through an interface with a floor-planning system. Rack PDU's, in turn, monitor their power outlets for changes in power demands and notify a centralized power management system of substantial changes. Such changes may be defined as percentage changes or changes that result in the power demand exceeding or falling below a threshold value. The definition of what constitutes a change may be user configurable. In yet another embodiment, network device power demand may be continuously or sporadically recorded, along with the date and time of the recording, for later use in determining the physical location of the network device.

At optional block 209, a change in network device utilization is detected. In one embodiment, these changes may include increases in disk I/O, CPU utilization, or a change in power mode initiated by normal network device operation. Such changes may be defined as percentage changes or changes that result in the network device utilization exceeding or falling below a threshold value. The definition of what constitutes a change may be user configurable. In another embodiment, network device utilization may be continuously or sporadically recorded, along with the date and time of the recording, for later use in determining the physical location of the network device.

At block 210, the physical location of the network device is determined based upon the recorded physical location of the power outlets. In one embodiment, this determination may be made by assigning the recorded physical location of the rack PDU or power outlet that experienced the change in power demand to the network device that executed the power consumption change instruction. In another embodiment, this determination may be made by comparing the power demand history of rack PDU's or power outlets to the utilization history of network devices. The system may assign the recorded physical location of a rack PDU or power outlet to the network device whose utilization history matches the rack PDU's or power outlet's power demand history.

At optional block 212, the power path of the network device may be determined based upon the power demanded as a function of time. In one embodiment, this determination is made by comparing the change in power demand across network devices at a series of specific times and associating network devices at different levels of the power distribution hierarchy that share substantially the same change in power demand. For example, a server may be instructed to change power consumption and as a result the generator, three phase PDU, UPS, ATS and rack PDU that supply that server may experience a decrease in power demand. Thus execution of this method may determine the power path to the server based on the change in power demand experienced by all six network devices. In another embodiment, no instructions are issued, and the power changes that are compared result from normal network device operations, such as changes in network device utilization. Such a change may include changes in disk I/O, CPU utilization, or a change in power mode initiated by normal network device operation.

At block 214, output is generated based on the recorded characteristics of the network devices. In a specific instance, such output includes, for example, a list of the power outlets associated with network devices, a list of power outlets not associated with network devices, a list of network devices associated with power outlets, and a graphical representation of the information technology network. Other example output may include a list of power outlets in a rack PDU, a list of rack PDU's in a rack, a list of racks in a room and a list of rooms in a building. Such a graphical representation may include the data center layout complete with specific network devices, racks and cooling systems. Alternatively, the representation may pictorially depict assorted network devices located throughout a building. In another embodiment the flow of power from its source in the data center through and into the network devices may be displayed.

At block 216, process 200 ends.

In one embodiment, blocks 204, 206, 208, 209, 210 and 212 are repeated for other network devices connected to the network. In an alternative embodiment, process 200 is repeated only for the network devices within a specific network subnet. Process 200 may be executed on demand or when a substantial change in power demand of any power outlet is detected. For example, in one embodiment when a network device is added or replaced, a change in power may be detected and process 200 executed. Additionally, process 200 may be scheduled as a one-time or reoccurring process.

Figure 2:
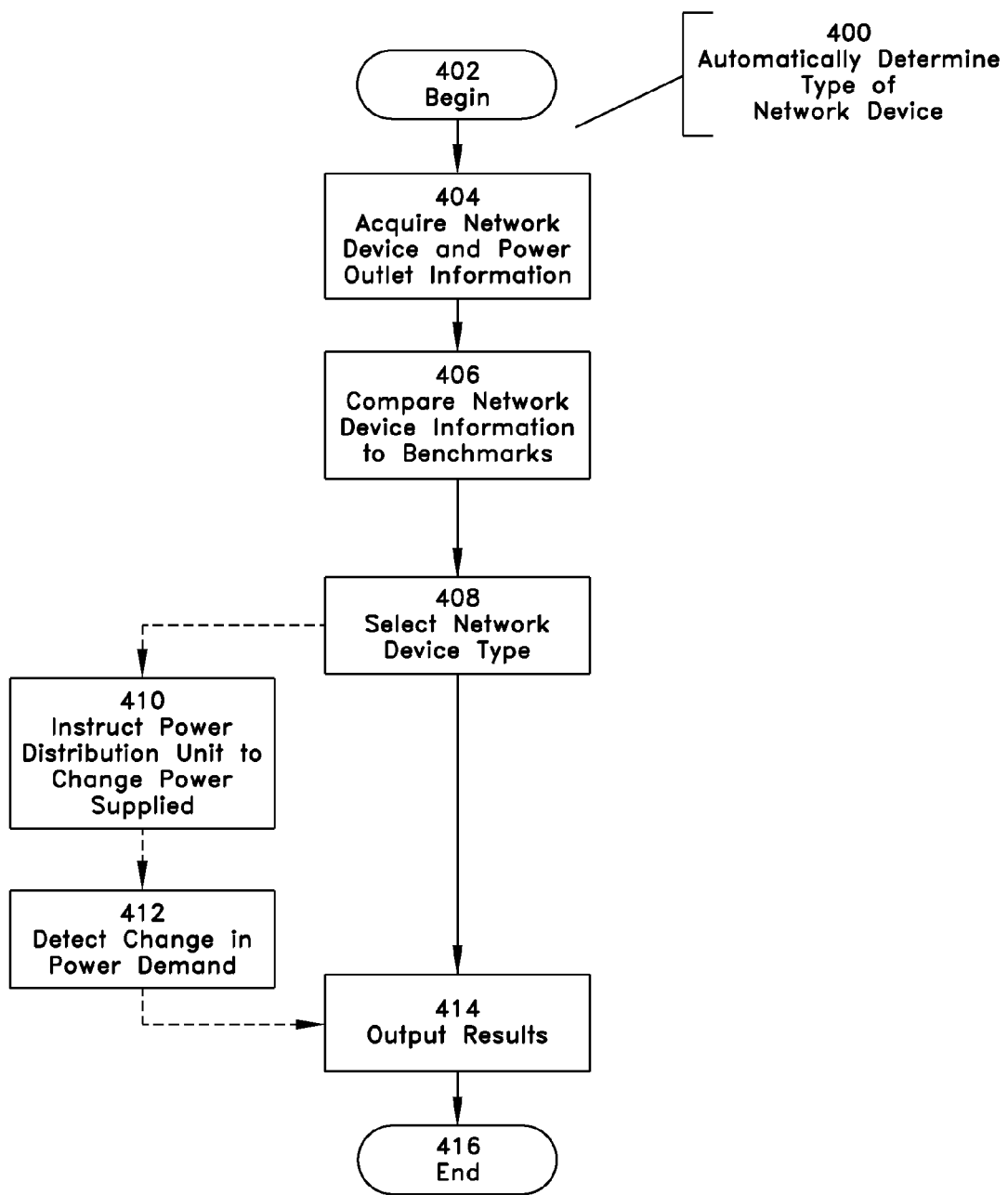
FIG. 2 is a flow chart of a process for automatically determining the functional type of network devices according to one embodiment of the invention.

FIG. 2 depicts an example process for automatically determining the functional type of one or more network devices according to one embodiment of the present invention. This process may be used to determine the functional type of network devices that do not support systemic querying of functional type or remotely instructed changes to power consumption. This process may be implemented using the InfraStruXure® Central Server discussed above or a general-purpose computer system as discussed with regard to FIG. 5 below. At block 402, process 400 begins. At block 404, network device and power outlet information may be acquired from various sources including through a network management system interface or through user data entry. In one embodiment, this information may include the identity of network devices attached to a network and any security credentials required to access the network devices, as well as network device power demand history and utilization history. This information may also include rack PDU or power outlet identity, rack PDU or power outlet location, and a list of the network devices that correspond to individual rack PDU's or power outlets.

At block 406, network device power consumption is compared to power consumption benchmarks to generate a list of potential network device functional types. This comparison may be based on power consumption over time or at an instant. In an embodiment, the benchmarks may include the minimum, maximum and average power consumed; power consumption as a function of time, e.g. power consumed by day of the week, week of the year, etc.; power actually consumed when a change in power consumption is requested; and power consumed as a function of network device utilization. The list of potential network devices may include any network device whose benchmarks are substantially close to the actual power demand at a power outlet. In one embodiment, a benchmark is substantially close to the actual power demand at a power outlet if the actual power demand falls within a range of the benchmark as configured by a user.

At block 408, the network device functional type is selected. In one embodiment, the functional type may be selected by default, e.g. if it is the only potential device functional type generated. Otherwise, the network device functional type may be selected from the list of potential functional types by a person based on his personal knowledge of the information technology network or by a person based on a physical inspection of the network device. In another embodiment, more specific information such as the manufacturer and model number of the device may be selected.

At optional block 410, a rack PDU is instructed to change the power supplied by a primary power outlet to a network device having redundant power supplies. The instruction may include the rack PDU, power outlet, and the target power level. In addition, in one embodiment, the target power level for the primary power outlet associated with the device recorded as having redundant power supplies may be set to a level that will cause the network device to activate its redundant power supplies, such as turning the power outlet off, in order to test for proper power installation.

At optional block 412, a change in the power demand at a secondary power outlet is detected. Such a change may be defined as a percentage change or a change that results in the power demand exceeding or falling below a threshold value. The definition of what constitutes a change may be user configurable. In one embodiment, an increase in power demand that is preceded by a decrease in power supplied by a rack PDU to a primary power supply, as in step 410, is used to establish which power outlets service network devices with redundant power supplies.

At block 414, output is generated based on the recorded characteristics of the network devices. In an embodiment, such output includes, for example, a report listing the functional type, manufacturer and model number of each network device. Other output may include a report listing of the network devices with redundant power supplies, and the rack PDU's and power outlets which supply them. Such output may be used, for example, to ensure that equipment with multiple power supplies is properly installed. Alternatively, a pictorial representation of the data center, complete with the functional type of network devices, may be displayed.

At block 416, process 400 ends.

In one embodiment, blocks 404, 406, 408, 410 and 412 are repeated for other network device connected to the network. In an alternative embodiment, process 400 is repeated only for the network devices within a specific network subnet. Process 400 may be executed on demand or when a substantial change in power demand of any power outlet occurs. For example, in one embodiment when a network device is added or replaced, a change in power may be detected and process 400 executed. Additionally, process 400 may be scheduled as a one-time or reoccurring process.

Figure 3:
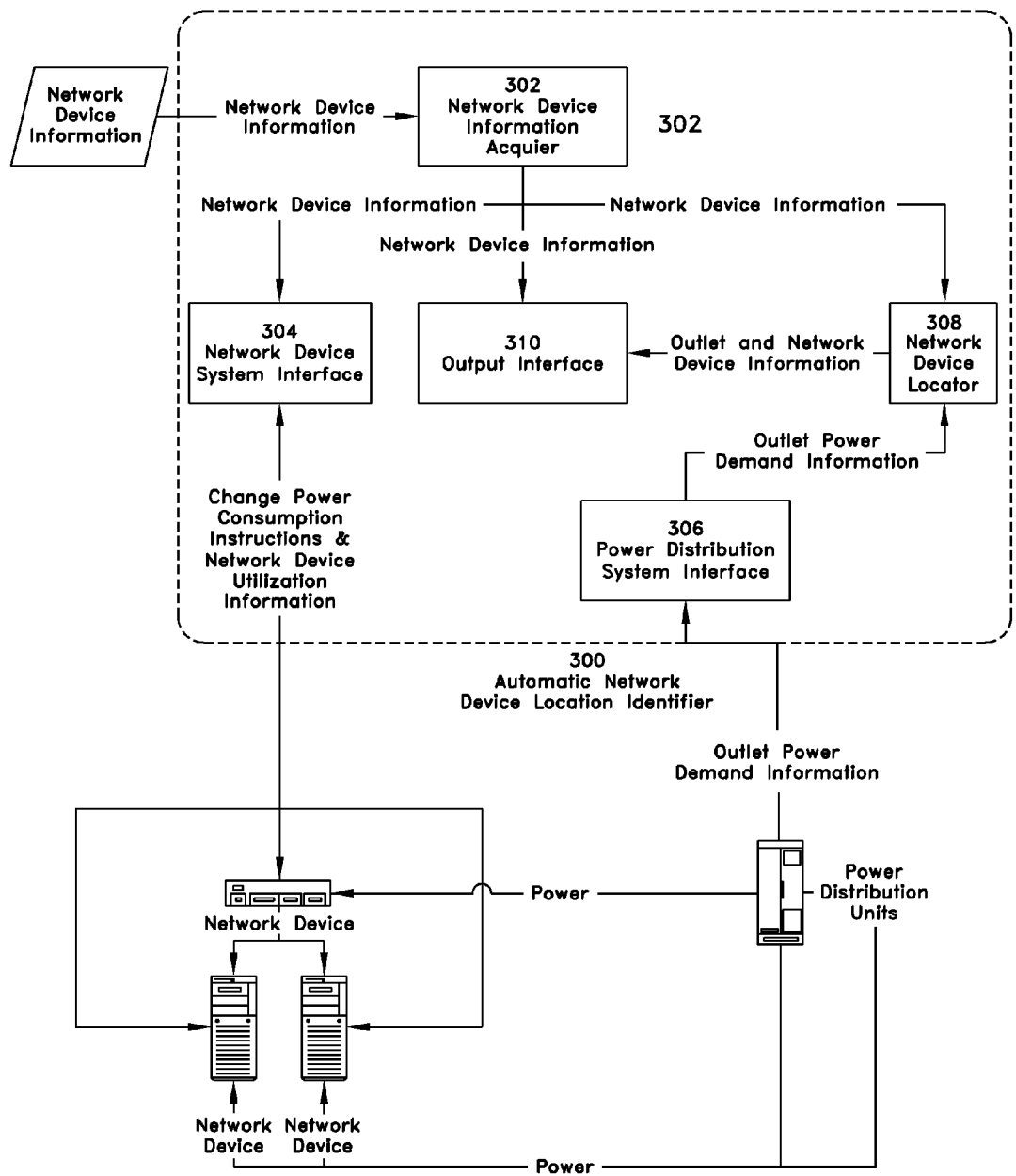
FIG. 3 shows, in context, a system for automatically determining the physical location of network devices in accordance with one embodiment of the invention.

FIG. 3 illustrates a system 300 for automatically determining the physical location of network devices according to one embodiment of the invention. Any of the recited modules may be implemented in customized software code or using existing software including a GUI, email, FTP, batch system interface, database system data movement tools, middleware, scanning with optical character recognition (OCR), any combination thereof, or otherwise. Moreover, the modular structure and content recited below is for exemplary purposes only and is not intended to limit the invention to the specific structure shown in FIG. 3. As will be apparent to one of ordinary skill in the art, many variant modular structures can be architected without deviating from the present invention. The particular modular arrangement presented in FIG. 3 was chosen to promote clarity. In one embodiment, system 300 may be implemented as a component of an automated centralized network manager, such as the InfraStruXure® Central Server discussed above.

System 300 may include a network device information acquirer module 302, a network device system interface module 304, a power distribution system interface module 306, a network device locator module 308, and an output interface 310. Module 302 accepts network device information from various sources and supplies modules 304, 308 and 310 with network device information. Module 304 accepts network device information from module 302, network device utilization information from network devices and supplies change power consumption instructions to network devices. Module 306 supplies power outlet power demand information to module 308. Module 308 supplies power outlet and network device information to module 310. Information may flow between these modules using any technique known in the art. Such techniques include passing the information over the network via TCP/IP, passing the information between modules in memory and passing the information by writing to a file, database, or some other non-volatile storage device.

Module 302 acquires network device information such as that discussed above with reference to block 204 of FIG. 1. In one embodiment, a unique network device identifier, such as TCP/IP address, functional device type, and security credential information may be manually keyed into the system through a custom implemented browser-based data entry screen. Alternatively, the system may import this information from an interface with another system, an encrypted data stream or from encrypted data files on a storage device. In another embodiment where network devices may respond to queries requesting functional type information, module 302 may use the unique network device identifier and any security credentials to record network device functional types.

Module 304 issues commands and accepts responses from network devices. In one embodiment, module 304 initiates power consumption changes in specific network devices and accepts network device utilization information from network devices. Module 304 may accept network device utilization information and initiate power consumption changes using any protocol that supports such interaction including Basic Input/Output System (BIOS) calls, Operating System calls, Intelligent Platform Management Interface (IPMI) calls, Power Supply Management Interface (PSMI) calls, Advanced Configuration & Power Interface (ACPI) calls, and SNMP calls. For instance, module 304 may include a server application that uses the network device name, to execute a remote procedure call to a client application running on the network device. The client application on the network device may, in response to the remote procedure call, execute an operating system command to change the power consumption mode of the network device to full power, or alternatively, to decrease power consumption to a minimum. Similarly, the operating system command may cause the network device to supply CPU utilization information to Module 304. In another embodiment, module 304 may reside on the network device, itself, and execute the operating system power consumption change command according to a predefined timetable or in response to a system event, e.g. when the network device boots.

Module 306 interfaces with and monitors various PDU's. In an embodiment, module 306 may monitor for changes in the power demanded at any power outlet. When a change in power demanded occurs, module 306 may request power outlet information. The information so requested may include the power outlet's identity, the power outlet's physical location, the power demanded at the power outlet and the change in the power demanded at the power outlet. In an alternate embodiment, module 306 may continuously or sporadically record the power demanded by network devices, along with the date and time of the recording, for later use in determining the physical location of the network device.

Module 308 establishes the physical location of the network device. In one embodiment, this is accomplished by recording the physical location of the power outlet that experienced a change in power demand as the physical location of the network device that was instructed to change power consumption. In another embodiment, the recorded network device power demand history may be compared against changes in network device utilization, such as increases in disk I/O, CPU utilization, or a change in power mode initiated by normal network device operation, to determine the rack PDU or power outlet that supplies the network device. Once identified, the physical location of this rack PDU or power outlet may be assigned to the network device.

Module 310 outputs information in various forms to enable other modules and network administration personnel to make use of the power outlet and network device information acquired. In an embodiment, for example, a list of the power outlets associated with network devices, a list of power outlets not associated with network devices, a list of network devices associated with power outlets, and a graphical representation of the information technology network are produced. This graphical representation may be produced from a database of network device images, e.g. blade servers and racks, and may show the network devices in the context of the data center. In another embodiment, the flow of power from its source in the data center through and into the network devices may be displayed.

If system 300 is implemented as a component of an automated centralized network manager, such as an InfraStruXure® Central Server, the network manager may communicate directly with various APC and other manufacturers' PDU's. A non-limiting list of such PDU's includes APC generators, three phase PDU's, UPS's, ATS's and rack PDU's, such as APC's Switched Rack PDU, Part Number AP7900.

Figure 4:
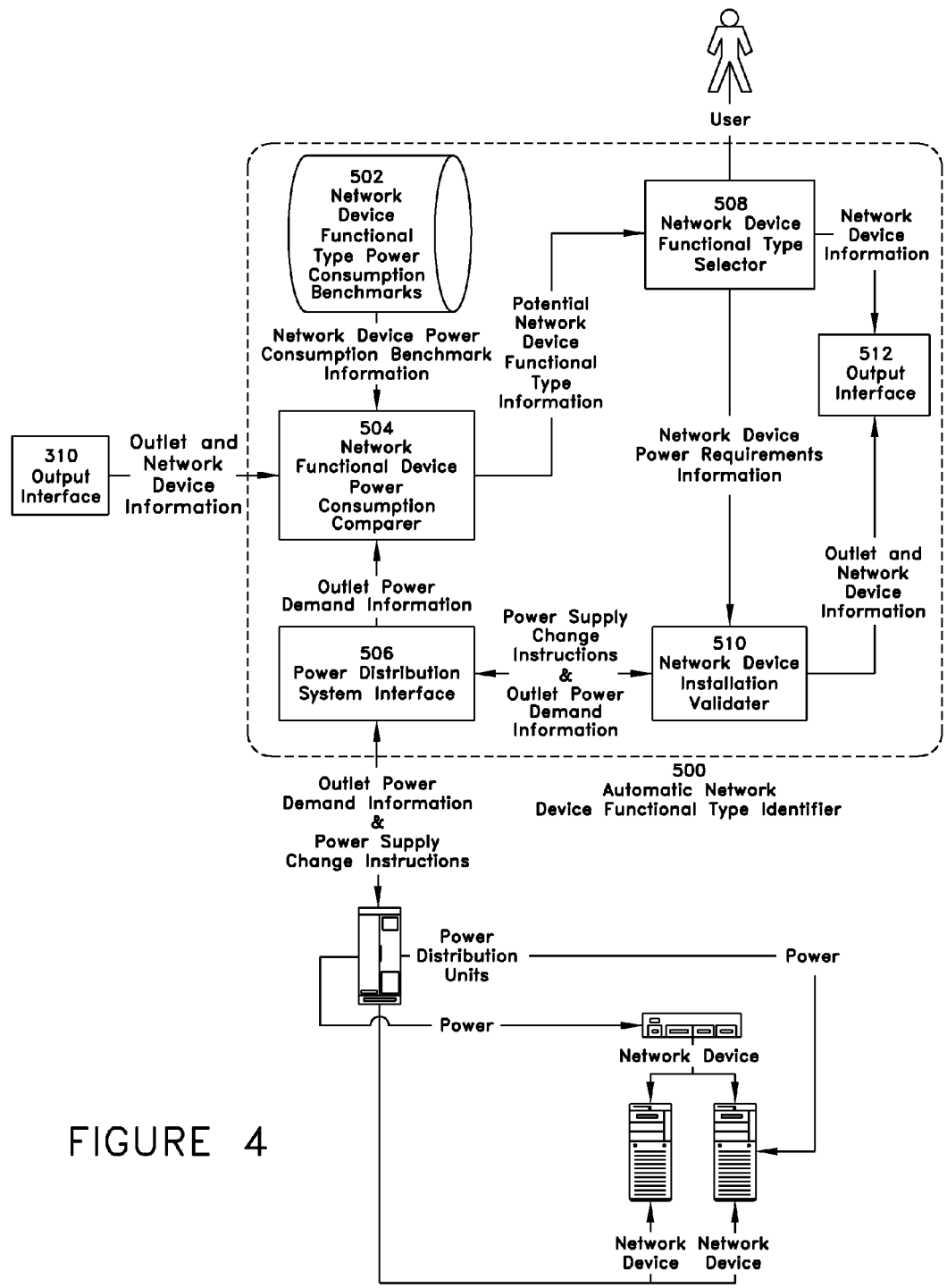
FIG. 4 depicts, in context, a system for automatically determining the functional type of network devices in accordance with one embodiment of the invention.

FIG. 4 illustrates a system 500 for automatically determining the functional type of network devices according to one embodiment of the invention. Any of the recited modules may be implemented in customized software code or using existing software including a GUI, email, FTP, batch system interface, database system data movement tools, middleware, scanning with optical character recognition (OCR), any combination thereof, or otherwise. Moreover, the modular structure and content recited below is for exemplary purposes only and is not intended to limit the invention to the specific structure shown in FIG. 4. As will be apparent to one of ordinary skill in the art, many variant modular structures can be architected without deviating from the present invention. The particular modular arrangement presented in FIG. 4 was chosen to promote clarity. In one embodiment, system 500 is implemented in an automated centralized network manager, such as an InfraStruXure® Central Server.

System 500 may include a network device functional type power consumption benchmark database 502, a network device functional type power consumption comparer module 504, a power distribution system interface module 506, a network device functional type selector module 508, a network device installation validator module 510, and an output interface 512. Database 502 contains benchmarks for power consumption based on network device functional type and supplies module 504 with this benchmark information. Module 504 accepts power outlet and network device information from module 310, e.g. which power outlets supply which network devices, power outlet power demand information from module 506 and network device functional type power consumption benchmark information from database 502. Module 504 supplies potential network device functional type information to module 508. Module 506 accepts power outlet power demand information from PDU's and supplies power change instructions to the PDU's and power outlet power demand information to module 510. Module 508 accepts potential network device functional type information from module 504 and supplies network device information to module 512 and information regarding network devices with redundant power supplies to module 510. Module 510 accepts information regarding network devices with redundant power supplies from module 508 and supplies power change instruction information to module 506 and power outlet and network device information to module 512. Module 512 accepts network device information from module 508 and network device installation information from module 510. Information may flow between these modules using any technique known in the art. Such techniques include passing the information over the network via TCP/IP, passing the information between modules in memory and passing the information by writing to a file, database, or some other non-volatile storage device.

Database 502 contains network device functional type power consumption benchmark information. Specifically, this information may include the minimum, maximum and average power consumption of listed network device functional types. Potential network device functional types include any grouping of network devices, e.g. servers, PDU's, desktop computers, laptop computers, routers, network capable printers, switches, VIOP PBX's, server appliances and IP telephones.

Module 504 compares the actual power outlet consumption information against the benchmarks to arrive at a set of potential network device functional types for a network device. In one embodiment, module 504 may use the power outlet to network device mapping provided by module 310 and the power outlet power consumption information provided by module 506 to determine the actual power consumed by a network device. Next, module 504 may, using the benchmark information provided by database 502, create a list of potential network device functional types for the network device by including in the list any device functional type whose benchmark average power consumption is substantially close to the actual average power consumption of the network device. In another embodiment, module 504 may also use the network device utilization history provided by module 310 to create a list of potential network device functional types for the network device by including in the list any device functional type whose benchmark power consumption, as a function of utilization, is substantially close to the actual power consumption as a function of utilization. In one embodiment, a benchmark is substantially close to the actual power demand at a power outlet if the actual power demand falls within a range of the benchmark as configured by a user.

Module 506 interfaces with and monitors various PDU's. In an embodiment, this interface may track actual power consumption statistics by power outlet. Module 506 may also issue power supply change instructions to PDU's in response to requests from module 510. In an alternate embodiment, module 506 may continuously or sporadically record the power demanded by network devices along with the date and time of the recording.

Module 508 establishes a functional type for the network device. In one embodiment, this is accomplished by allowing a user to select from a list of potential device functional types via a user interface. The user may make the selection based on personal knowledge or after physically inspecting the network device. In another embodiment, the system may select the functional type based on a set of predefined rules. For instance, if the system can ascertain only one potential network device functional type for a specific device, it may automatically select that device functional type for that network device.

Module 510 validates that the power supplies of a network device have been coupled to the proper rack PDU. In one embodiment, module 510 uses the network device functional type power requirement information provided by module 508 to determine which network devices have redundant power supplies and issues a power supply change instruction to module 506 requesting that power outlets supplying the primary power supply of the network device be substantially reduced. Once the primary supply of the network device experiences a substantial reduction in power, the network device will switch to one of its redundant sources. At that point, module 506 may report to module 510, the identity of the power outlet that supplies the secondary power supply. Module 510 may determine, for example, whether the two power outlets reside on different rack PDU's, as they should if the network device was properly installed.

Module 512 outputs information in various forms to enable other modules and network administration personnel to make use of the power outlet and network device information acquired. In an embodiment, for example, a report listing improperly installed network devices and the network devices and their associated functional types is produced. In another embodiment, a pictorial representation of the data center racks is displayed, including individual network devices depicted according to the recorded functional type of each.

When system 500 is implemented as a component of an automated centralized network manager, such as an InfraStruXure® Central Server, the network manager may communicate directly with various APC and other manufacturers' PDU's. A non-limiting list of such PDU's includes APC generators, three phase PDU's, UPS's, ATS's and rack PDU's, such as APC's Switched Rack PDU, Part Number AP7900.

The above defined processes 200 and 400, according to one embodiment of the invention, may be implemented on one or more general-purpose computer systems. For example, various aspects of the invention may be implemented as specialized software executing in a general-purpose computer system 400 such as that shown in FIG. 5. Computer system 400 may include one or more output devices 401, one or more input devices 402, a processor 403 connected to one or more memory devices 404 through an interconnection mechanism 405 and one or more storage devices 406 connected to interconnection mechanism 405. Output devices 401 typically render information for external presentation and examples include a monitor and a printer. Input devices 402 typically accept information from external sources and examples include a keyboard and a mouse. Processor 403 typically performs a series of instructions resulting in data manipulation. Processor 403 is typically a commercially available processor such as an Intel Pentium, Motorola PowerPC, SGI MIPS, Sun UltraSPARC, or Hewlett-Packard PA-RISC processor, but may be any type of processor. Memory devices 404, such as a disk drive, memory, or other device for storing data is typically used for storing programs and data during operation of the computer system 400. Devices in computer system 400 may be coupled by at least one interconnection mechanism 405, which may include, for example, one or more communication elements (e.g., busses) that communicate data within system 400.

Figure 6:
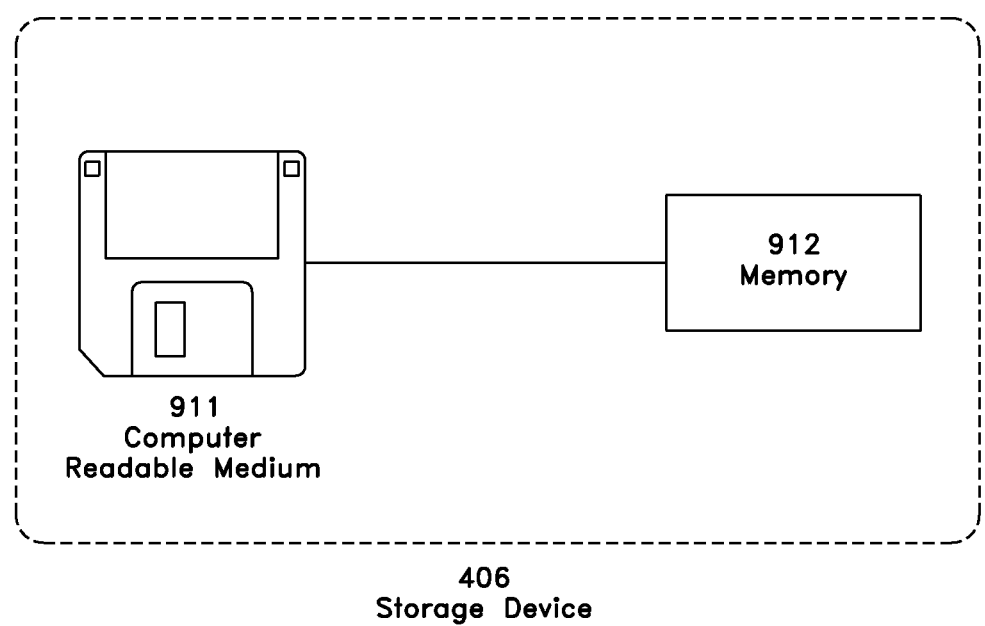
FIG. 6 illustrates a storage device of a general-purpose computer system.

The storage device 406, shown in greater detail in FIG. 6, typically includes a computer readable and writeable nonvolatile recording medium 911 in which signals are stored that define a program to be executed by the processor or information stored on or in the medium 911 to be processed by the program. The medium may, for example, be a disk or flash memory. Typically, in operation, the processor causes data to be read from the nonvolatile recording medium 911 into another memory 912 that allows for faster access to the information by the processor than does the medium 911. This memory 912 is typically a volatile, random access memory such as a dynamic random access memory (DRAM), static memory (SRAM) or flash memory. It may be located in storage device 406, as shown, or in memory device 404. The processor 403 generally manipulates the data within the memory 404, 912 and then copies the data to the medium 911 after processing is completed. A variety of mechanisms are known for managing data movement between the medium 911 and the memory 404, 912, and the invention is not limited thereto. The invention is not limited to a particular memory device 404 or storage device 406.

Computer system 400 may be implemented using specially programmed, special purpose hardware, or may be a general-purpose computer system that is programmable using a high-level computer programming language. Computer system 400 usually executes an operating system which may be, for example, the Windows 95, Windows 98, Windows NT, Windows 2000, Windows ME, Windows XP, Windows Vista or other operating systems available from the Microsoft Corporation, MAC OS System X available from Apple Computer, the Solaris Operating System available from Sun Microsystems, or UNIX operating systems available from various sources (e.g., Linux). Many other operating systems may be used, and the invention is not limited to any particular implementation. For example, an embodiment of the present invention may instruct network devices to change power consumption a general-purpose computer system with a Sun UltraSPARC processor running the Solaris operating system.

Figure 5:
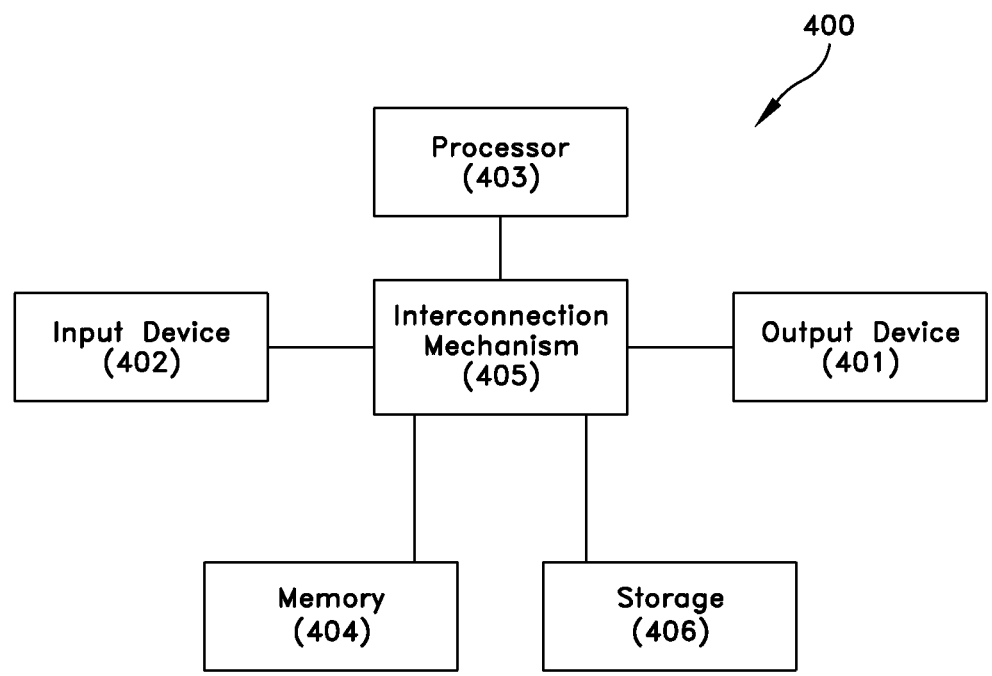
FIG. 5 shows a general-purpose computer system upon which various embodiments of the invention may be practiced.

Although computer system 400 is shown by way of example as one type of computer system upon which various aspects of the invention may be practiced, it should be appreciated that the invention is not limited to being implemented on the computer system as shown in FIG. 5. Various aspects of the invention may be practiced on one or more computers having a different architecture or components than that shown in FIG. 5. To illustrate, one embodiment of the present invention may acquire network device information using several general-purpose computer systems running MAC OS System X with Motorola PowerPC processors and several specialized computer systems running proprietary hardware and operating systems.

Figure 7:
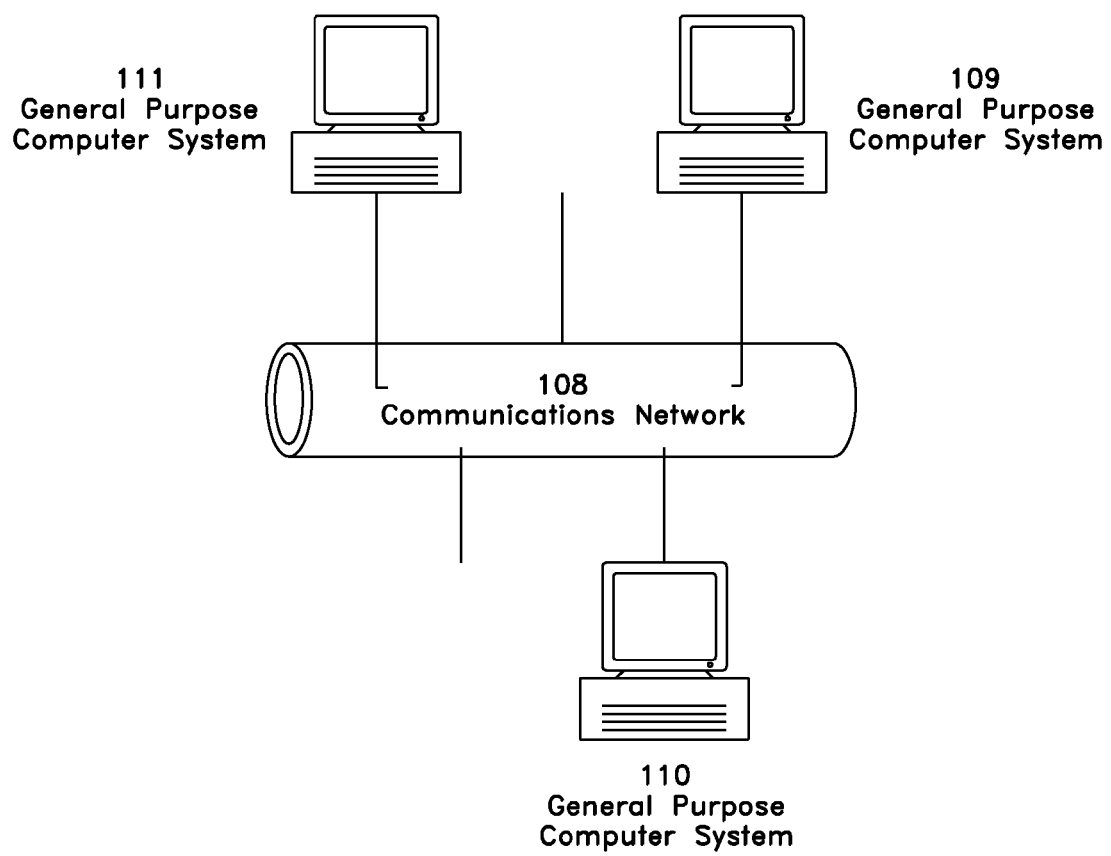
FIG. 7 depicts a network of general-purpose computer systems.

As depicted in FIG. 7, one or more portions of the system may be distributed to one or more computers (e.g., systems 109-111) coupled to communications network 108. These computer systems 109-111 may also be general-purpose computer systems. For example, various aspects of the invention may be distributed among one or more computer systems configured to provide a service (e.g., servers) to one or more client computers, or to perform an overall task as part of a distributed system. More particularly, various aspects of the invention may be performed on a client-server system that includes components distributed among one or more server systems that perform various functions according to various embodiments of the invention. These components may be executable, intermediate (e.g., IL) or interpreted (e.g., Java) code which communicate over a communication network (e.g., the Internet) using a communication protocol (e.g., TCP/IP). To illustrate, one embodiment may acquire network device information though a browser interpreting HTML forms and may interface with PDU's using a data translation service running on a separate server.

Various embodiments of the present invention may be programmed using an object-oriented programming language, such as SmallTalk, Java, C++, Ada, or C# (C-Sharp). Other object-oriented programming languages may also be used. Alternatively, functional, scripting, and/or logical programming languages may be used. Various aspects of the invention may be implemented in a non-programmed environment (e.g., documents created in HTML, XML or other format that, when viewed in a window of a browser program, render aspects of a graphical-user interface (GUI) or perform other functions). Various aspects of the invention may be implemented as programmed or non-programmed elements, or any combination thereof. For example, a security credentials information data entry screen may be implemented using a Microsoft Word document while the application designed to initiate network device power consumption changes may be written in C++.

It should be appreciated that a general-purpose computer system in accord with the present invention may perform functions outside the scope of the invention. For instance, aspects of the system may be implemented using an existing commercial product, such as, for example, Database Management Systems such as SQL Server available from Microsoft of Seattle Wash., Oracle Database from Oracle of Redwood Shores, Calif., and MySQL from MySQL AB of UPPSALA, Sweden and WebSphere middleware from IBM of Armonk, N.Y. If SQL Server is installed on a general-purpose computer system to implement an embodiment of the present invention, the same general-purpose computer system may be able to support databases for sundry applications.

Based on the foregoing disclosure, it should be apparent to one of ordinary skill in the art that the invention is not limited to a particular computer system platform, processor, operating system, network, or communication protocol. Also, it should be apparent that the present invention is not limited to a specific architecture or programming language.

Figure 8:
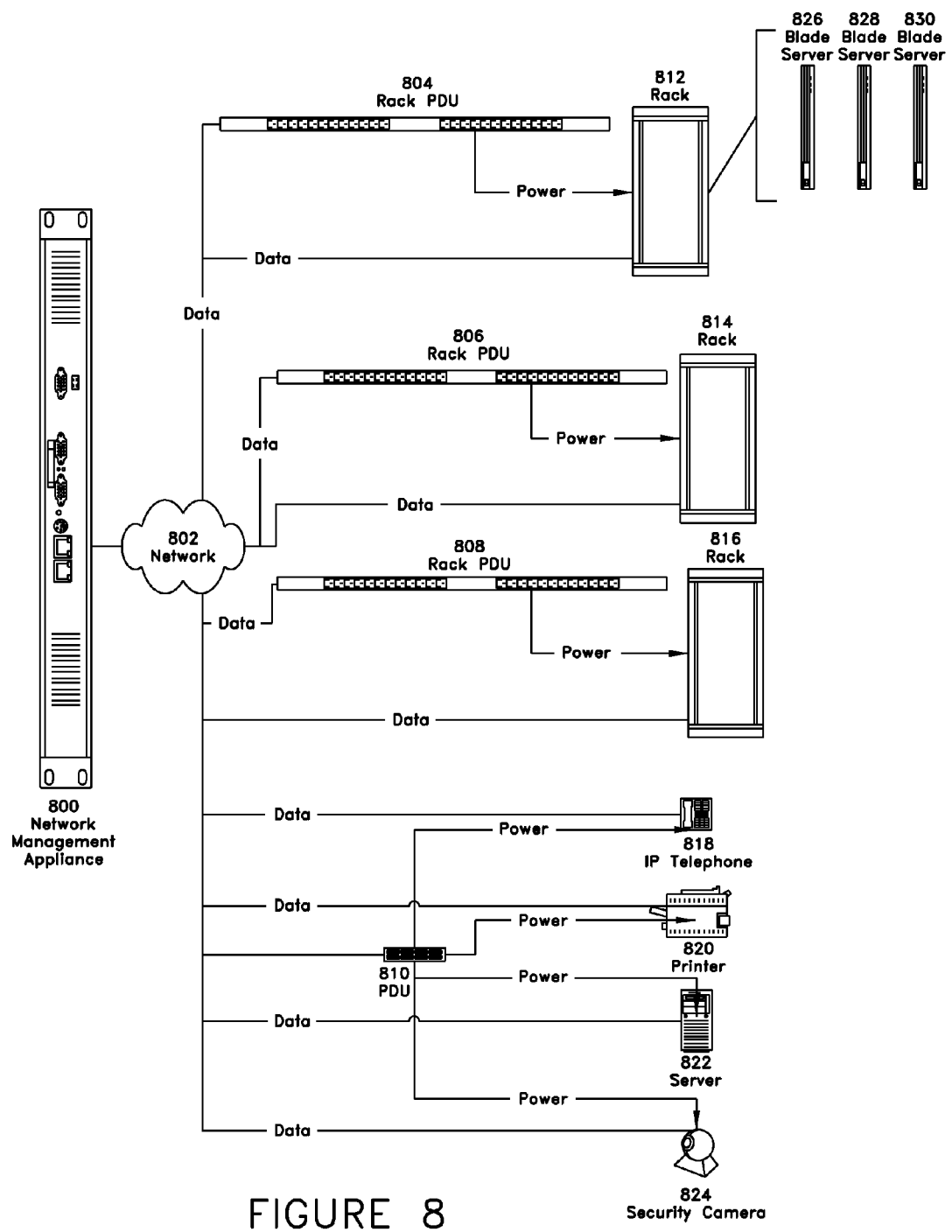
FIG. 8 shows a data center in which a system for automatically determining the physical location and functional device type of network devices in accordance with one embodiment of the invention is present.

FIG. 8 illustrates one embodiment in accord with the present invention when implemented in a centralized data center environment. Network management appliance 800 is connected to network 802. Network 802 is connect to rack PDU's 804, 806 and 808, and the network devices housed in racks 812, 814 and 816, such as blade servers 826, 828 and 830. Network 802 is also connected to IP telephone 818, printer 820, Server 822 and security camera 824. Rack PDU's 804, 806 and 808 supply power to the network devices housed in racks 812, 814 and 816, respectively. PDU 810 supplies power to IP telephone 818, printer 820, server 822 and security camera 824.

In one embodiment an instance of the automatic network device location identifier 300, as shown in FIG. 3, may be active on network management appliance 800. Alternatively, an instance of the automatic network device type identifier 500, as shown in FIG. 4, may be active on network management appliance 800. Network management appliance 800 may be any device capable of executing centralized network management software including, for example, the InfraStruXure® Central Server. The network upon which the network management appliance and the network devices are resident may be any computer network ranging from a general-purpose LAN/WAN to a more basic, isolated and dedicated power management network.

In accordance with an embodiment of the present invention, network management appliance 800 may issue change power consumption instructions through network 802 to various network devices, such as security camera 824, printer 820 and blade servers 826, 828 and 830. Network management appliance 800 may monitor, through network 802, the power demand levels at each power outlet in PDU's 804, 806, 808 and 810 to determine which power outlet services the target of the change power consumption instruction. The PDU may stand alone or be physically built into a server rack or other network device enclosure. Protocols that may be used to monitor power demand levels at the power outlet include SMTP and IMPI. Network appliance 800 may repeat this process for each network device that is targeted for physical location discovery. The accuracy of the physical location discovery may range from several feet, e.g. the distance between the power outlet and the network device, to the specific location of a network device within a rack.

Figure 9:
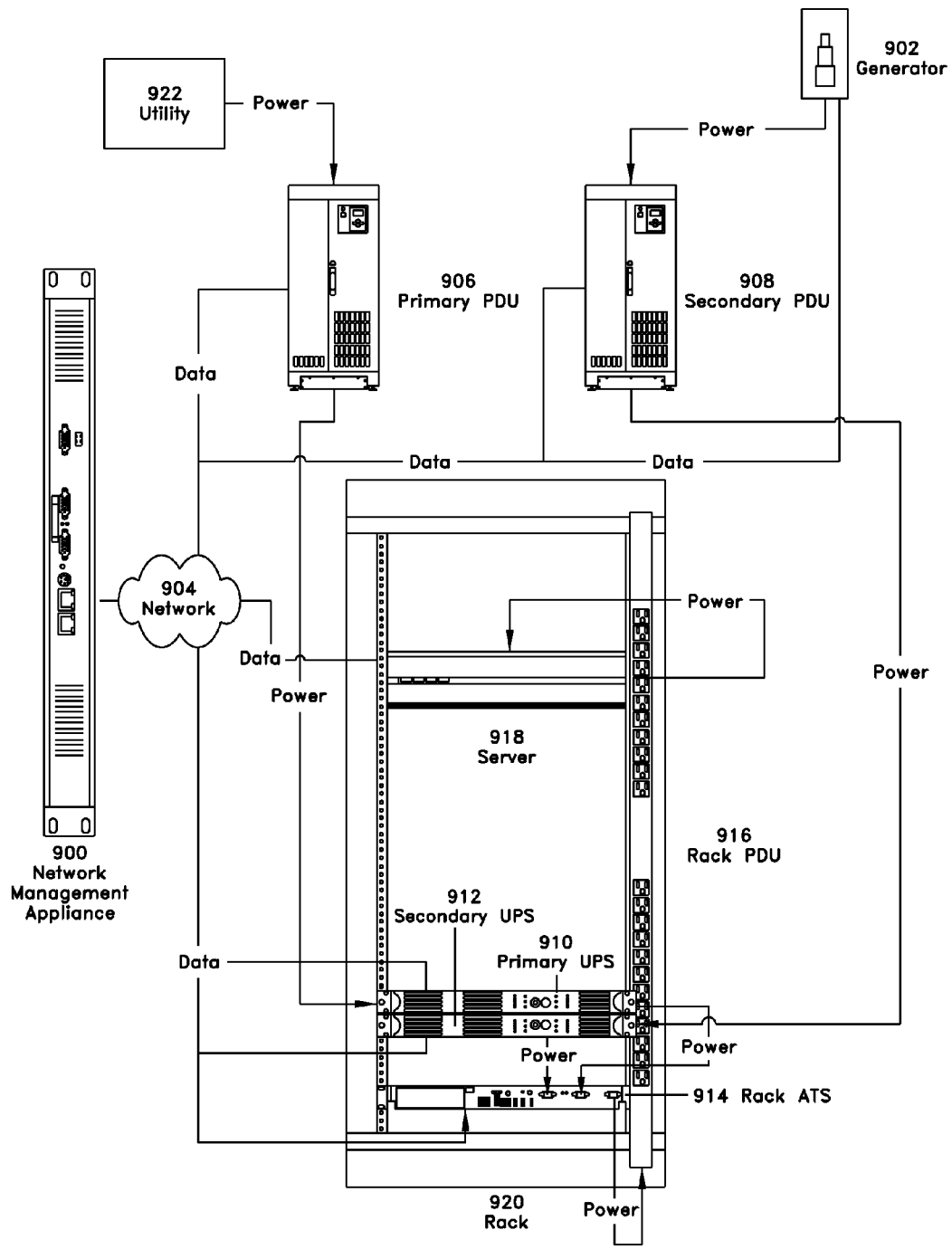
FIG. 9 illustrates another data center in which a system for automatically determining the physical location of network devices in accordance with one embodiment of the invention is present.

FIG. 9 depicts another embodiment in accord with the present invention when implemented in a centralized data center environment. Network management appliance 900 is connected to network 904. Network 904 is connected to several network devices including generator 902, primary PDU 906, secondary PDU 908, primary UPS 910, secondary UPS 912, rack ATS's 914, rack PDU 916 and server 918. Utility feed 922 and generator 902 supply power to primary PDU 906 and secondary PDU 908, respectively. Primary PDU 906 and secondary PDU 908 supply power to primary UPS 910 and secondary UPS 912. Primary UPS 910 and secondary UPS 912 redundantly supply power to rack ATS 914. Rack ATS 914 supplies power to rack PDU 916. Rack PDU 916 supplies power to server 918. Rack 920 houses rack ATS 914, primary UPS 910, secondary UPS 912, rack PDU 916 and server 918.

In one embodiment an instance of the automatic network device location identifier 300, as shown in FIG. 3, may be active on network management appliance 900. Network management appliance 900 may be any device capable of executing centralized network management software including, for example, the InfraStruXure® Central Server. The network upon which the network management appliance and the network devices are resident may be any computer network ranging from a general-purpose LAN/WAN to a more basic, isolated and dedicated power management network.

In accordance with an embodiment of the present invention, network management appliance 900 may monitor and record, through network 904, the change in power demand over time of various network devices, such as server 918, rack ATS 914, primary UPS 910, secondary UPS 912, rack PDU 916, primary PDU 906, secondary PDU 908 and generator 902. Network management appliance 900 may then compare the change in power demand at the various breaker positions of primary PDU 906 to the change in power demand at primary UPS 910, rack ATS 914, rack PDU 916 and server 918. Network appliance 900 may then associate the breaker positions that experience substantially the same change in power demand as primary UPS 910 with primary UPS 910. In a similar fashion, network appliance 900 may also associate primary UPS 910 with rack ATS 914, rack ATS 914 with rack PDU 916, and rack PDU 916 with server 918. Lastly, using this comparison procedure, network appliance may also associate generator 902, secondary PDU 908, secondary UPS 912, rack ATS 914, rack PDU 916 and server 918.

Network appliance 900 may then chart a power path between these network devices based on these associations. Other network devices may be added to the power path in the same manner.

Having now described some illustrative embodiments of the invention, it should be apparent to those skilled in the art that the foregoing is merely illustrative and not limiting, having been presented by way of example only. While the bulk of this disclosure is focused on data center embodiments, aspects of the present invention may be applied to other types of information technology networks, for instance LAN's and WAN's. Similarly, aspects of the present invention may be used to achieve other objectives including power conservation and network device monitoring. Numerous modifications and other illustrative embodiments are within the scope of one of ordinary skill in the art and are contemplated as falling within the scope of the invention. In particular, although many of the examples presented herein involve specific combinations of method acts or system elements, it should be understood that those acts and those elements may be combined in other ways to accomplish the same objectives. Acts, elements and features discussed only in connection with one embodiment are not intended to be excluded from a similar role in other embodiments.

What is claimed is:

1. A method of determining a functional type of a network device, the method comprising:
   monitoring, by a computer system, power drawn by the network device at a power distribution device; and
   determining, by the computer system, the functional type of the network device by comparing an amount of power drawn to a benchmark amount of power drawn by the functional type of network device.

2. A non-transitory computer-readable medium having computer-readable signals stored thereon that define instructions that, as a result of being executed by a processor, instruct the processor to perform the method of claim 1.

3. The method of claim 1, wherein the determining the functional type of the network device comprises:
   generating a list of potential network device functional types that receive power supplied by the power distribution device by comparing the power drawn to the benchmark;
   presenting the list of potential network device functional types for selection; and
   receiving the selection.

4. The method of claim 1, further comprising:
   determining at least one network device including a transfer switch having a first input for a first power supply and a second input for a second power supply; and
   presenting the at least one network device including a transfer switch.

5. The method of claim 4, further comprising presenting a power distribution device that supplies the first power supply and a power distribution device that supplies the second power supply.

6. The method of claim 1, further comprising determining, by the computer system, a physical location of the network device based on a physical location of the power distribution device.

7. The method of claim 6, wherein determining the physical location of the network device comprises:
   detecting a change in power at the power distribution device, wherein the power distribution device is coupled to the network device to provide power to the network device; and
   comparing the change in power to a change in utilization of the network device.

8. The method of claim 7, wherein the change in utilization of the network device comprises at least one of a change in disk I/O, a change in CPU utilization, and a change in power mode initiated by normal network device operation.

9. The method of claim 7, further comprising, prior to detecting the change in power, waiting for an event to occur.

10. The method of claim 9, wherein the event includes instructing the network device to change power consumption.

11. The method of claim 10, wherein instructing the network device to change power consumption includes instructing the network device to reduce power consumption.

12. The method of claim 11, wherein instructing the network device to change power consumption includes accessing the network device over a network.

13. The method of claim 10, wherein instructing the network device to change power consumption includes instructing the network device to increase power consumption.

14. A system for automatically detecting a functional type of a network device, the system comprising:
   at least one input arranged and configured to receive network device information;
   at least one controller arranged and configured to generate a list of potential network device functional types of devices that receive power supplied by a power distribution device, wherein the at least one controller is arranged and configured to generate the list by comparing an amount of power demand at the power distribution device to a benchmark amount of power drawn by the functional type of network device;
   at least one output arranged and configured to display the list of potential network device functional types for selection; and
   at least one input arranged and configured to record the selection.

15. The system of claim 14,
   wherein the at least one controller is further arranged and configured to determine at least one network device including a transfer switch having a first input for a first power supply and a second input for a second power supply; and
   wherein the at least one output is further arranged and configured to display the at least one network device including a transfer switch.

16. The system of claim 15,
   wherein the at least one output is further arranged and configured to display a power distribution device that supplies the first power supply and a power distribution device that supplies the second power supply.

17. The system of claim 14, wherein the at least one controller is further arranged and configured to detect a change in power at a power distribution device having a physical location and coupled to the network device, and further arranged and configured to determine the physical location of the network device.

18. The system of claim 17, wherein the at least one controller is further arranged and configured to instruct at least one network device to change power consumption.

* * * * *